United States Patent
Hamerski et al.

(10) Patent No.: US 6,803,298 B2
(45) Date of Patent: Oct. 12, 2004

(54) METHOD OF MANUFACTURING A DEVICE WITH EPITAXIAL BASE

(75) Inventors: Roman J. Hamerski, Olathe, KS (US); Gary W. Gladish, Lake Winnebago, MO (US)

(73) Assignee: FabTech, Inc., Lee's Summit, MO (US)

( * ) Notice: Subject to any disclaimer, the term of this patent is extended or adjusted under 35 U.S.C. 154(b) by 0 days.

(21) Appl. No.: 10/455,119

(22) Filed: Jun. 4, 2003

(65) Prior Publication Data

US 2003/0205781 A1 Nov. 6, 2003

Related U.S. Application Data

(62) Division of application No. 09/506,420, filed on Feb. 17, 2000, now abandoned.

(51) Int. Cl.[7] ............................................. H01L 21/22
(52) U.S. Cl. ...................................... 438/549; 257/927
(58) Field of Search ................................ 438/965, 969, 438/549; 257/927

(56) References Cited

U.S. PATENT DOCUMENTS

| | | | |
|---|---|---|---|
| 3,579,815 A | | 5/1971 | Gentry |
| 3,706,129 A | | 12/1972 | McCann |
| 3,852,876 A | | 12/1974 | Sheldon et al. |
| 3,859,127 A | | 1/1975 | Lehner |
| 4,252,576 A | * | 2/1981 | Hasegawa et al. ......... 148/33.4 |
| 4,255,757 A | | 3/1981 | Hikin |
| 4,373,255 A | | 2/1983 | Goronkin |
| 4,740,477 A | | 4/1988 | Einthoven et al. |
| 4,891,685 A | * | 1/1990 | Einthoven et al. ............ 357/56 |
| 5,164,813 A | | 11/1992 | Blackstone et al. |
| 5,262,669 A | | 11/1993 | Wakatabe et al. |
| 5,393,711 A | | 2/1995 | Biallas et al. |
| 5,482,887 A | | 1/1996 | Duinkerken et al. |
| 5,640,043 A | | 6/1997 | Eng et al. |
| 5,661,091 A | | 8/1997 | Duinkerken et al. |
| 5,679,153 A | | 10/1997 | Dmitriev et al. |
| 5,877,039 A | | 3/1999 | Tanizawa |
| 5,882,986 A | | 3/1999 | Eng et al. |
| 5,892,264 A | * | 4/1999 | Davis et al. ................. 257/511 |
| 5,930,660 A | * | 7/1999 | Davis ......................... 438/549 |
| 6,011,313 A | | 1/2000 | Shangguan et al. |
| 6,107,674 A | | 8/2000 | Zommer |
| 6,162,665 A | | 12/2000 | Zommer |
| 6,482,749 B1 | | 11/2002 | Billington et al. |

FOREIGN PATENT DOCUMENTS

JP         57017167        1/1982

* cited by examiner

Primary Examiner—David Nelms
Assistant Examiner—Quoc Hoang
(74) Attorney, Agent, or Firm—Blackwell Sanders Paper Martin LLP

(57) ABSTRACT

A high voltage electrical device (20), having a substrate layer (22), base layer (24) and top layer (26), provides high voltage properties in excess of 1000V. Slicing a wafer (28) from an ingot (30) created in by monocrystalline growth forms the substrate layer (22), and this high quality crystal is used as the high resistivity layer in the device (20). The base layer (24) is a highly doped, low resistivity, epitaxial layer deposited on the lower surface (32) of the substrate layer (22) at a fast rate greater than approximately 2 microns/minute. The top layer (26) is a diffusion layer diffused into an upper surface (34) of the substrate layer (22). To control stress in the wafer (28), the epitaxial base is doped with germanium.

4 Claims, 1 Drawing Sheet

METHOD OF MANUFACTURING A DEVICE WITH EPITAXIAL BASE

This application is a Div of Ser. No. 09/506,420 ABN Feb. 17, 2000.

COPYRIGHT NOTICE AND AUTHORIZATION

A portion of the disclosure of this patent document contains material, which is subject to mask work protection. The mask work owner has no objection to the facsimile reproduction by anyone of the patent document or the patent disclosure, as it appears in the Patent and Trademark Office patent file or records, but otherwise reserves all mask work rights whatsoever.

FIELD OF THE INVENTION

This invention relates to electrical devices and, more particularly, to high voltage electrical devices including monocrystalline semiconductor substrate layers and epitaxial base layers utilizing positive bevel angles to increase operational voltage.

BACKGROUND OF THE INVENTION

The use and complexity of electronic equipment continue to increase around the world, and the functions performed by electronic equipment continue to improve and expand. As complexity increases and functions expand and improve, the operational requirements of the electrical devices used in electronic equipment have also increased. The newly introduced high definition televisions, for example, require diodes rated at 1700V, but currently available diodes are only rated at 1600V. This has required high definition television manufacturers to test for and choose the best of the available 1600V diodes leading to increased cost.

To construct a high voltage diode requires a high resistivity layer having a sufficient thickness and resistance to provide a reverse voltage blocking capability. Further, it is necessary to control and minimize the electric field at the edges of the diode. In a typical construction, the low resistivity epitaxial layer is deposited on a highly doped, single crystal semiconductor substrate layer. To maintain the purity and single crystal structure in the epitaxial layer, the epitaxial layer must be deposited at a low rate of about one (1) micron per minute. However, as the thickness of the epitaxial layer increases, it becomes more difficult to maintain the single crystal structure with a low defect level. Thus, there is an increased number of defects in the epitaxial layer, which can undesirably limit the operational parameters of the diode. Further, the deposition rate of the epitaxial layer must be slowed further thereby increasing manufacturing cost and allowing the junction between the doped substrate and the pure epitaxial layer to become more gradual due to diffusion from the substrate to the epitaxial layer.

Attempts to address these problems have lead to the development of entirely diffused structures. However, such diffused structures offer less attractive electrical parameters. For example, because the P/N junction of a diffused structure is gradual, the voltage drop or loss across a high voltage, fast switching, diffused structure diode can be as high as 5V. In contrast, the voltage drop for a high voltage, fast switching, epitaxial structure diode with an abrupt junction can be as low as 1.7V. Further, it is commercially unfeasible to manufacture more than one diffused structure diode on each wafer because of the high diffusion depth necessary to provide sufficient thickness in the bottom layer to keep the wafer from breaking after moats are etched to form the separate diodes. Additionally, diffusion beyond normal depths can warp the wafers making them more difficult to handle and increases the occurrences of breakage.

BRIEF SUMMARY OF THE INVENTION

There is, therefore, provided in the practice of the invention a novel electrical device, which is inexpensive and easy to manufacture, for use in high voltage applications. The electrical device broadly includes a high resistivity substrate layer, a low resistivity base layer, and a low resistivity top layer. The substrate layer is formed by crystalline growth method to form an ingot which is sliced to at least a desired thickness of the substrate layer, and the base layer is an epitaxial layer deposited on a surface of the substrate layer.

In a preferred embodiment, the top layer comprises a diffusion layer, and the substrate layer is an $N^-$ conductive type with a thickness in the range of approximately 50 to 130 microns. This thickness provides a device rated at between approximately 1500V and 2200V, respectively. The size of the device can be changed to accommodate various forward current and forward voltage combinations. A typical 6.5 amp device has top dimensions of approximately 2500 microns by 2500 microns. The top layer is $N^+$ type and has a central recess minimizing, in a central portion of the electrical device, the distance between the top layer and the epitaxial layer, thus minimizing the electric field at the edge of the device. The base layer is preferably a $P^+$-type layer and has a thickness in the range of 200 to 400 microns to provide sufficient thickness needed to maintain the mechanical structure and the electrical base after channels are etched throughout the remaining process steps such as passivation of the high voltage junction, metallization, and any photolithography steps employed in the process as needed.

It is further contemplated in the practice of the invention that the device is separated from a semiconductor wafer along with a plurality of other devices. The wafer includes a high resistivity substrate layer formed with a crystalline growth method, a low resistivity base layer, and a low resistivity top layer. The wafer also includes a plurality of intersecting channels forming a grid in the wafer to separate the individual electrical devices.

In a preferred embodiment, the base layer is an epitaxial base layer doped with germanium to control the stress in the wafer. The wafer is generally circular, and when the diameter of the wafer is approximately 100 mm and has 2500 micron by 2500 micron devices formed thereon, the wafer includes approximately 1000 individual devices.

It is still further contemplated in the practice of the invention that the electrical device is formed with a method for fabricating a plurality of high voltage devices. In the method, a high resistivity ingot is grown with a monocrystalline structure by a crystalline growth method, and at least one wafer is sliced from the ingot to form a substrate. A highly doped, low resistivity base layer is formed on a first surface of the substrate, and a low resistivity top layer is formed on a second surface of the substrate. The wafer is then divided to form the separate devices.

In a preferred embodiment, the process is repeated with additional wafers sliced from the ingot and with still more wafers sliced from additional ingots. Forming the base layer preferably comprises depositing the base layer on the substrate. The method also includes doping the base layer with the dopant providing opposite polarity to the substrate and a stress control dopant, preferably germanium, and adjusting the concentration of the stress control dopant, so that the wafer is substantially flat and has minimal stress. The low resistivity top layer is preferably formed by diffusion Accordingly, it is an object of the present invention to provide an improved electrical device for high voltage applications.

It is another object of the present invention to provide an improved method of fabricating high voltage electrical devices.

BRIEF DESCRIPTION OF THE DRAWINGS

These and other inventive features, advantages, and objects will appear from the following Detailed Description when considered in connection with the accompanying drawings in which similar reference characters denote similar elements throughout the several views and wherein.

For the purpose of clarity in illustrating the characteristics of the present invention, accurate proportional relationships of the elements thereof have not been maintained in the Figures. Further, the sizes of certain small devices and elements thereof have been exaggerated.

DETAILED DESCRIPTION

Figure 1:
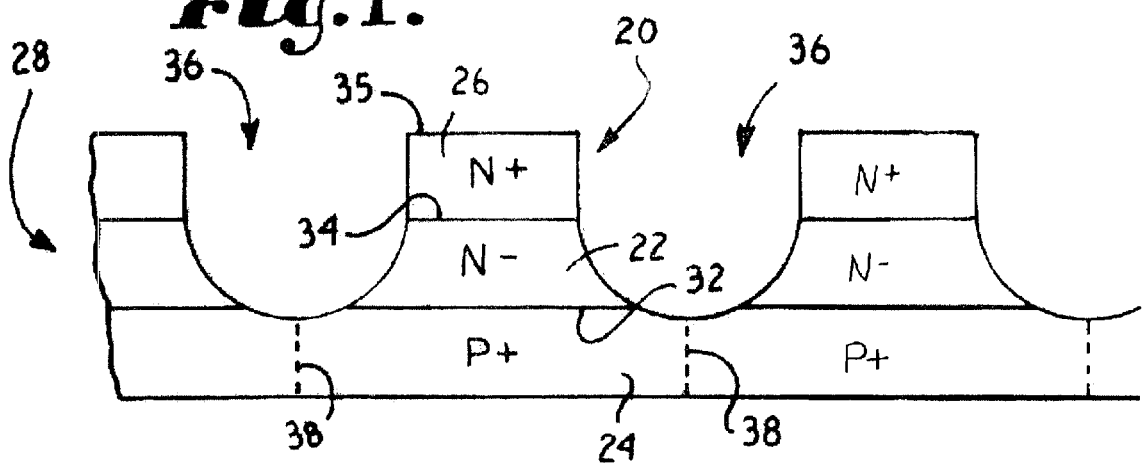
FIG. 1 is a schematic cross sectional view of a wafer including a plurality of electrical devices according to the present invention.
Figure 2:
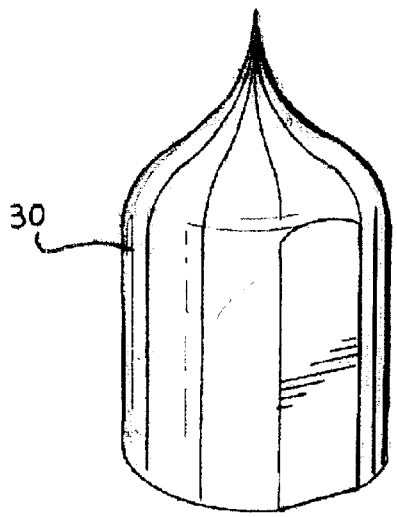
FIG. 2 is a schematic elevational view of a monocrystalline semiconductor ingot.

Referring to the drawings in greater detail, FIG. 1 shows an electrical device specifically a diode 20 constructed in accordance with a preferred embodiment of the present invention. The diode 20 broadly includes a high resistivity, monocrystalline grown substrate layer 22, a low resistivity epitaxial base layer 24, and a low resistivity top layer 26. The diode 20 is formed as part of and divided from a wafer 28 (FIG. 3) including the various layers 22–26 and which is originally sliced from an ingot 30 (FIG. 2). The diode 20 can be rated at a voltage of 1750V and higher because the large thickness of the high resistivity layer required for such high voltage devices is feasibly obtained by using the substrate layer 22 as the high resistivity layer of the diode 20.

Figure 3:
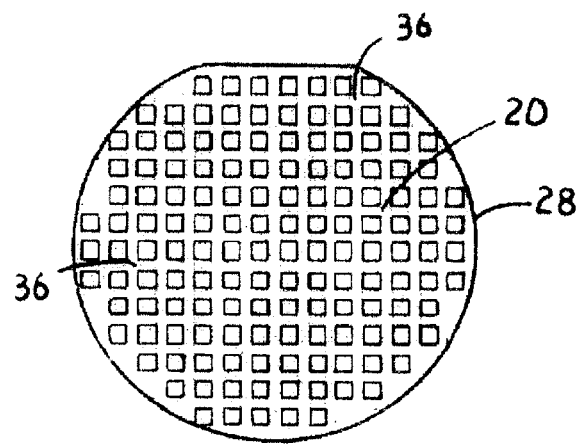
FIG. 3 is a top plan view of the wafer of FIG. 1.

Referring to FIGS. 1, 2, and 3, the substrate layer 22 is formed with a high purity, monocrystalline, semiconductor material by a monocrystalline growth method well known in the industry. In the growth method, a pool of lightly doped liquid semiconductor material is seeded with a small crystal. As the seed is slowly drawn out of the pool, the molten silicon aligns with the lattice structure of the seed crystal to form the generally cylindrical ingot 30 of semiconductor material, which is preferably silicon. The high quality semiconductor material can also be fabricated with the float zone method also well known in the industry. The ingot 30 is then sliced into generally circular wafers 28 (FIG. 3), which at this phase include only the substrate layer 22. The substrate layer has a first, lower surface 32, and a second, upper surface 34. The first and second surfaces 32, 34 are spaced apart and substantially parallel, and they are distinguished as lower and upper surfaces only for clarity in identifying them in the orientation of the device as shown in the drawings. The substrate layer has a substrate layer conductive type, which is preferably N⁻ type. Thus, the dopant/impurity level in the pool is low, so that the substrate layer has a high resistivity to conducting current. Alternatively, a neutron transformation doping method can be used to control dopant level. The resistance of the substrate layer is preferably in the range of approximately 15 Ohmcm to approximately 400 Ohmcm. The preferred value in this range is approximately 60 Ohmcm.

The thickness of the substrate layer 22 before any additional processing is at least as thick as a desired thickness of the substrate layer in the completed diode 20. To provide a diode rated at approximately 1500V, the desired thickness of the substrate layer is approximately 70 microns, and for a diode rated at approximately 2200V, the desired thickness of the substrate layer is approximately 130 microns. For high definition televisions, the preferred device is rated at 1750V, but with the electric field at the edge of the diode properly controlled, the present invention can provide voltage ratings in excess of 3000V. Thus, the thickness ranges from approximately 50 microns to approximately 200 microns and higher, with a more preferred range of approximately 70 microns to approximately 150 microns. These thicknesses, which would be generally commercially unfeasible if even obtainable through epitaxial deposition, are made obtainable and feasible by the present invention.

The base layer 24 is formed contiguous with the first surface 32 of the substrate layer 22. The base layer 24 is highly doped with a base dopant, and thus, the base layer 24 has a low resistivity. The base layer conductive type is preferably P⁺ type. Thus, the base conductive type is opposite the substrate conductive type. Though the particular dopants used to achieve the conducting layers of the present invention will not be described particularly, it should be understood that boron can be used as a P-type dopant while phosphorous, arsenic, and antimony can be used as N-type dopants for silicon. Similarly, the semiconductor material can be silicon, germanium, or any compound semiconductor material such as gallium arsenide with appropriate changes to the dopant material depending on the semiconductor material selected.

The base layer 24 must be deep enough to permit channels 36 to be formed in the wafer, so that the individual devices can be defined in and divided from the wafer 30. The channels preferably extend entirely through two of the three layers, so that the unsevered layer should support the wafer without breakage. To that end the base layer ranges in thickness from approximately 200 microns to approximately 400 microns. However, depending on the diameter of the wafer, the thickness can increase and decrease out of this range. Preferably, the base layer is an epitaxial base layer deposited on the substrate layer first surface 32 at an increased deposition rate ranging from approximately 2 microns/minute to approximately 3 microns/minute. At a deposition rate of 3 microns/minute, some polysilicon can start to form. It is desirable to deposit the base layer as fast as possible without forming any polysilicon. However, this fast rate, two to three times that of a high resistivity layer, is possible because the purity and regularity of the low resistivity layer is less important than in the high resistivity layer. This allows the device to be formed much more quickly and cost effectively than if the high resistivity layer were formed by epitaxial deposition.

The fast deposition rate of the base layer also limits the amount of dopant that diffuses into the substrate layer. Thus, the P/N junction at the first surface 32 is abrupt allowing for a diode structure with a low voltage drop and fast switching characteristics for given voltage rating. In addition to the P-type dopant, the base layer 24 is also doped with germanium to control the stress in the wafer 28. The concentration of germanium generally matches the concentration of boron in the layer. Thus, the germanium concentration is preferably in the range of approximately $2 \times 10^{19}$ atoms/cm$^3$ to approximately $5 \times 10^{19}$ atoms/cm$^3$. The germanium concentration can be as much as approximately 150% of the P-type or N-type dopant concentration.

The top layer 26 has a top layer conductive type of N$^+$, and is formed contiguous with the substrate layer second surface 34. The top layer 26 is preferably formed by diffusing an N-type dopant into the top surface 35 to form a top diffusion layer, but the top layer could also be an epitaxial layer. Because of the N-type dopant, the top layer has a low resistivity. The N$^+$ layer is identified as the top layer only to clearly identify it in the orientation of the device as shown in the drawings.

In the method for fabricating the diode 20, the ingot 30 is grown with the monocrystalline growth method, and the wafer 28 is sliced from the ingot 30 to form the substrate layer 22. The epitaxial base layer 24 is deposited on the first surface 32, and the top diffusion layer 26 is diffused into the top surface 35. If the top layer is diffused into the top surface 35, the substrate layer is ground to the total thickness of the substrate layer plus the top layer. Because diffusion is a high temperature step, the comparable thickness of layer 22 becomes diffused with boron across surface 32. For this reason, an additional thickness is added to the targeted post grinding thickness of the N$^-$ substrate layer. If the top layer 26 is deposited on the second surface 34, the substrate layer is ground to its desired thickness prior to depositing the top layer. Preferably, the base layer 24 is grown prior to diffusion of the top layer 26, but the order can be reversed. This process is repeated with additional wafers sliced from the ingot 28 and with further wafers sliced from additional ingots. After these steps, the wafers include all three layers 22, 24, and 26.

As the layers are deposited, the wafers are monitored to check for warping. If a wafer is checked and is concave when viewed from the bottom/base layer side of the wafer, the germanium concentration is increased to relieve stress and flatten the wafer. If a wafer is checked and is convex when viewed from the bottom/base layer side of the wafer, the germanium concentration is decreased to relieve stress and flatten the wafer. Thus, the germanium concentration is adjusted to relieve stress and keep the wafers substantially flat. Further processing steps, such as deposition of electric contacts and passivation, the specifics of which are not necessary to gain a full understanding of the invention, will be omitted. Additionally, known intermediate processing steps, such as polishing and cleaning, are also omitted from the discussion of the invention.

With the three layers 22, 24, and 26 in place, the channels are formed in the wafer 28. The channels are preferably formed by masking and etching the top side of the wafer. The etching forms a grid of moats which define the separate devices, and the devices are then divided from the wafer along cut lines 38 in the bottom of the moats. Though the devices are shown in a regular grid of aligned rows and columns, staggered grid arrangements are contemplated to optimize the space on the wafer. Alternatively, the bottom side of the wafer could be etched. However, the top side is preferably etched to obtain a positive bevel angle. The termination angle is preferably greater than approximately 15°, and more preferably, greater than approximately 57°. That is the surface area of the P/N junction at the first surface 32 is greater than the surface area at the N$^-$/N$^+$ junction at the second surface 34. The high voltage devices are generally intended for low current use, so that they are rated at between approximately 1 amp and approximately 100 amps, with a more preferred range of approximately 1 amp to 20 amps. A preferred device is rated at approximately 1750V of reverse surge protection and approximately 7 amps in the forward conducting direction. The top view dimensions (i.e. from the view illustrated in FIG. 3) of these devices are approximately 2500 microns by approximately 2500 microns. Thus, approximately 1000 of these devices are manufactured with a single wafer of approximately 100 mm diameter.

Figure 4:
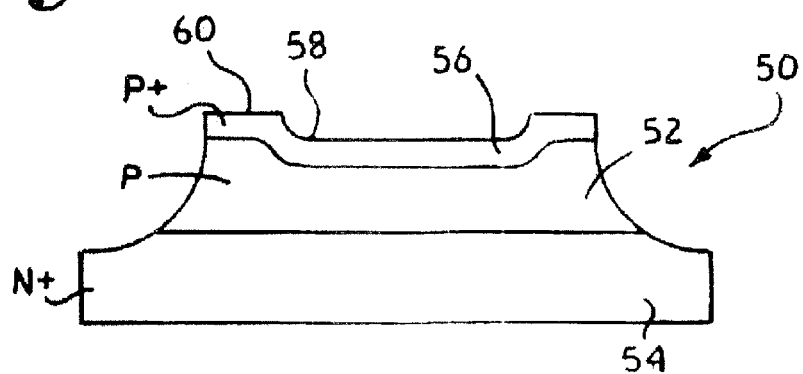
FIG. 4 is a schematic sectional view of an alternate electrical device according to the present invention.

In an alternate embodiment shown in FIG. 4, an electrical device 50 is shown with a monocrystalline growth substrate layer 52, an epitaxial base layer 54, and a diffusion top layer 56. In this embodiment, the high resistivity substrate layer 52 is P$^-$ type; the low resistivity base layer is N$^+$ type, and the low resistivity top layer is P$^+$ type. A generally centrally located recess 58 is etched into a top surface 60 of the substrate prior to diffusing the top layer 56 into the top surface 60. The central recess 58 creates a recessed pattern in the diffusion layer, so that the P$^+$ layer is closer to the N$^+$ layer in the central region of the device. This pattern of the diffusion layer minimizes and controls the electric field at the edge of the device 50.

By using the highest quality high resistivity silicon next to the lower quality, quickly deposited low resistivity base layer 24, numerous opportunities are presented in the area of high voltage devices. Thus, the present invention can find application in high voltage rectifiers, bipolar transistors, insulated gate bipolar transistors, the entire family of metal oxide semiconductor transistors, and other electrical devices in power and nonpower applications.

Thus, an electrical device and method of fabrication therefor are disclosed which utilize a monocrystalline growth, high resistivity substrate layer and an epitaxial, low resistivity base layer to form a high voltage electrical device. While preferred embodiments and particular applications of this invention have been shown and described, it is apparent to those skilled in the art that many other modifications and applications of this invention are possible without departing from the inventive concepts herein disclosed. It is, therefore, to be understood that, within the scope of the appended claims, this invention may be practiced otherwise than as specifically described, and the invention is not to be restricted except in the spirit of the appended claims. Though some of the features of the invention may be claimed in dependency, each feature has merit if used independently.

What is claimed is:

1. A method for fabricating a plurality of high voltage electrical device, the method comprising:

growing a high resistivity monocryatalline ingot from a semiconductor material having a substrate conductive type;

slicing at least one wafer having a desired thickness from the ingot, the wafer providing a substrate including first and second spaced and generally parallel surfaces;

epitaxially depositing a highly doped, low resistivity, base layer contiguous with the first surface of the substrate, and the base layer having a base layer conductive type wherein the base layer is deposited at a deposition rate ranging from approximately 2 microns/minute to approximately 3 microns/minute;

forming a low resistivity top layer contiguous with the second surface of the substrate, and the top layer having a top layer conductive type; and dividing the wafer to form separate electrical devices.

2. The method according to claim 1 wherein dividing the wafer comprises etching the wafer to form a grid of moats and separating the electrical devices along the moats, and forming the top layer comprises diffusing a dopant into the second surface.

3. The method according to claim 1 further comprising grinding the substrate to a desired substrate thickness after the base layer is formed, thereby forming a high resistivity substrate layer.

4. The method according to claim 1 further comprising doping the base layer with a stress control dopant, and adjusting the concentration of the stress control dopant so that the wafer is substantially flat.

* * * * *